(12) United States Patent
Sumant et al.

(10) Patent No.: US 8,652,946 B2
(45) Date of Patent: Feb. 18, 2014

(54) GRAPHENE LAYER FORMATION ON A CARBON BASED SUBSTRATE

(75) Inventors: Anirudha V. Sumant, Plainfield, IL (US); Alexander Balandin, Riverside, CA (US)

(73) Assignee: Uchicago Argonne, LLC., Chicago, IL (US)

( * ) Notice: Subject to any disclaimer, the term of this patent is extended or adjusted under 35 U.S.C. 154(b) by 0 days.

(21) Appl. No.: 13/448,068

(22) Filed: Apr. 16, 2012

(65) Prior Publication Data
US 2013/0273720 A1    Oct. 17, 2013

(51) Int. Cl.
*H01L 21/20* (2006.01)

(52) U.S. Cl.
USPC ............ 438/479; 438/509; 257/E21.27

(58) Field of Classification Search
USPC ............ 438/479, 509; 257/E21.27
See application file for complete search history.

(56) References Cited

U.S. PATENT DOCUMENTS

| | | | |
|---|---|---|---|
| 7,781,061 B2 * | 8/2010 | Garcia et al. | 428/402 |
| 2009/0047520 A1 * | 2/2009 | Lee et al. | 428/408 |
| 2010/0218801 A1 * | 9/2010 | Sung et al. | 136/244 |
| 2011/0048625 A1 * | 3/2011 | Caldwell et al. | 156/233 |
| 2012/0141799 A1 * | 6/2012 | Kub et al. | 428/408 |
| 2012/0181501 A1 * | 7/2012 | Sung | 257/9 |

OTHER PUBLICATIONS

Freitag, et al., "Energy Dissipation in Graphene Field-Effect Transistors", *Nano Letters*, Mar. 30, 2009, pp. 1883-1888, vol. 9, No. 5, American Chemical Society, USA.

Lin et al., "100-ghZ Transistors from Wafer-Scale Epitaxial Graphene", *Brevia*, Feb. 5, 2010, p. 662, vol. 327, Science, 222. sciencemag.org.

Kim et al., "Low-temperature synthesis of large-area graphene-based transparent conductive films using surface wave plasma chemical vapor deposition", *Applied Physics Letters*, (2011), pp. 091502, vol. 98, American Institute of Physics.

Weatherup et al., "In Situ Characterization of Allow Catalysts for Low-Temperature Graphene Growth", *Nano Letters*, (2011), pp. 4154-4160, vol. 11, ACS Publications, American Chemical Society.

Li et al., "Synthesis, Characterization, and Properties of Large-Area Graphene Films", *ECS Transactions*, (2009) 19(5) pp. 41-52, The Electrochemical Society.

Yu et al., "Bilayer Graphene System: Current-Induced Reliability Limit", *IEEE Electron Device Letters*, Oct. 2010, pp. 1155-1157, IEEE.

Schwierz, Frank, "Industry-compatible graphene transistors", *Nature*, Apr. 7, 2011, vol. 472, pp. 41-42, Macmillan Publishers Limited.

Yu et al., "Graphene-on-Diamond Devices with Increased Current-Carrying Capacity: Carbon $sp^2$-on-$sp^2$ Technology", *Nano Letters*, (2012), pp. A-F, American Chemical Society.

Lee et al., "Breakdown Current Density of CVD-Grown Multilayer Graphene Interconnects", *IEEE Electron Device Letters*, Apr. 2011, pp. 557-559, IEEE.

Grierson et al., "Thermal Stability and Rehybridization of Carbon Bonding in Tetrahedral Amorphous Carbon", *Journal of Applied Physics*, (2010), 7 pages, American Institute of Physics.

* cited by examiner

*Primary Examiner* — Trung Q Dang
(74) *Attorney, Agent, or Firm* — Foley & Lardner LLP

(57) ABSTRACT

A system and method for forming graphene layers on a substrate. The system and methods include direct growth of graphene on diamond and low temperature growth of graphene using a solid carbon source.

14 Claims, 14 Drawing Sheets

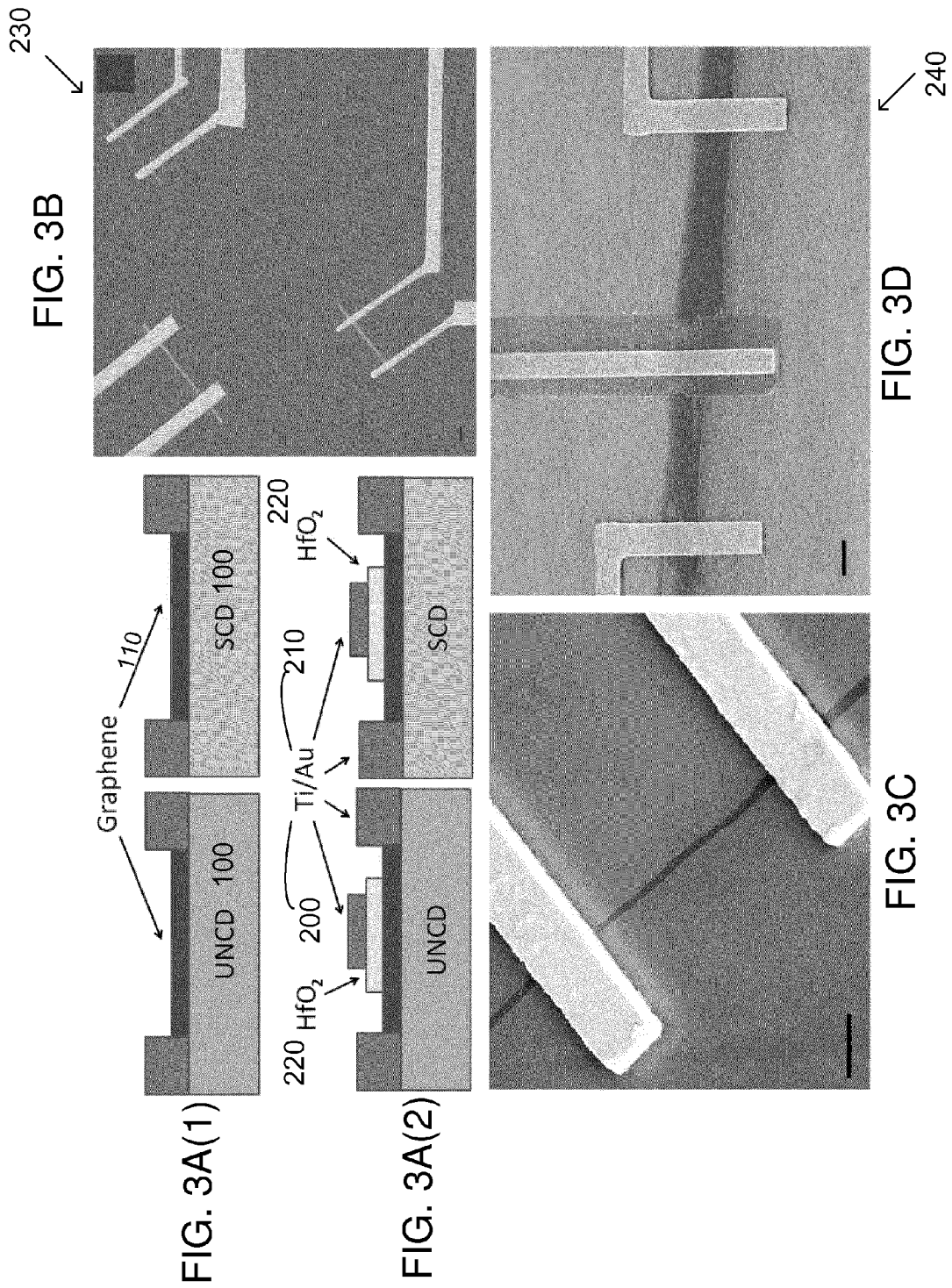

GRAPHENE LAYER FORMATION ON A CARBON BASED SUBSTRATE

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD OF THE INVENTION

The invention relates generally to methods and systems for forming graphene layers on a carbon based substrate. More particularly this invention relates to methods and systems for growth of graphene, including direct growth of graphene on diamond and low temperature growth of graphene using a solid carbon source.

BACKGROUND OF THE INVENTION

Since the discovery of graphene and realization of its exceptional electronic properties in suspended form, there have been many efforts in fabricating FET-type devices based on single and bilayer graphene on a $SiO_2$ substrate. However, performance of these devices is found to be inferior to the expected intrinsic properties of graphene. It has been observed that apart from carrier mobility in graphene, which is sensitive to trapped charges, and surface impurities at the graphene-oxide interlace, breakdown current density in graphene depends sensitively on the heat dissipation property of the underlying supporting substrate. Although graphene has extremely high intrinsic thermal conductivity, it is reported that in graphene devices that more than 70% of the heat dissipates through the 300 nm $SiO_2$ on silicon directly below the active graphene channel. The remainder of the heat is carried to the graphene that extends beyond the device and metallic contacts. Such a distribution of heat into the substrate cause undesirable effects on the overall performance of a device, such as the thermally generated carriers affecting the electronic mobility parameters of a device fabricated on top of the substrate.

The breakdown current density measurements of multi-layer and few layer graphene disposed on a $SiO_2$/Si substrate have been reported to be in the range of $7\times10^7$ to $10^8$ A/cm$^2$. The main breakdown mechanism of graphene is mostly due to the Joule heating, which sensitively depends upon the thermal conductivity and surface roughness of the underlying substrate. The thermal conductivity of $SiO_2$ K=0.5-1.4 W/mK at RT is more than two orders-of-magnitude smaller than that of Si, K=145 W/mK, which suggests that the use of a better heat-conducting material, directly below graphene, can improve graphene's JBR. Recently, it was demonstrated that replacement of $SiO_2$ with diamond-like carbon (DLC) helps to substantially improve the RF characteristics of the scaled graphene transistors. However, DLC is an amorphous material with K=0.2-3.5 W/mK at room temperature (hereinafter "RT"), which is a very low value and is close to that in $SiO_2$. Additionally, depending on the hydrogen content, the as deposited DLC films has high internal stress, which needs to be released by having to perform a separate step of annealing these films at higher temperatures (about 600° C.). These negative attributes provide a very strong motivation for the search for other materials which can be used as substrates for graphene based devices.

SUMMARY OF THE INVENTION

In one embodiment conventional $SiO_2$ substrates are replaced with diamond, such as synthetic single crystal diamond ("SCD") hereinafter and a graphene layer. The problem of prior art systems concerning heat dissipation is substantially reduced, leading to an order of magnitude increase in breakdown current density ("JPR" hereinafter) reaching up to one thousand times improvement over conventional metal based interconnects in FET-type devices and other electronic device applications like RF transistors. In other embodiments the substrate can be ultranano crystalline diamond ("UNCD" hereinafter) with grain size diameters of about 5-10 nm, resulting in improving JPR about 50% as compared to graphene on $SiO_2$ as a result of the increased thermal conductivity of the UNCD at elevated temperatures, close to the thermally-induced breakdown point.

In yet another embodiment a method and system provides direct growth of graphene layers on diamond, thereby eliminating various transfer processes previously required. In this process the diamond substrate can be single crystal or polycrystalline diamond.

In a further embodiment a method and system are provided for low temperature growth of graphene by using a solid carbon source and preferably using a Ni surface as the substrate, thereby allowing single or multilayer graphene in a controlled manner.

These and other advantages and features of the invention, together with the organization and manner of operation thereof, will become apparent from the following detailed description when taken in conjunction with the accompanying drawings.

BRIEF DESCRIPTION OF THE DRAWINGS

FIG. 3A(1) illustrates a schematic of a two terminal device and FIG. 3A(2) a three terminal device fabricated for testing an UNCD/Si and a SCD substrate; FIG. 3B illustrates an optical microscopy image of the two terminal graphene processing device/prototype interconnect on a single crystal diamond; FIG. 3C illustrates an SEM image of the two terminal graphene for producing an UNCD/Si device; and FIG. 3D illustrates a three terminal graphene for producing an UNCD/Si device;

DETAILED DESCRIPTION OF PREFERRED EMBODIMENTS

Figure 1:
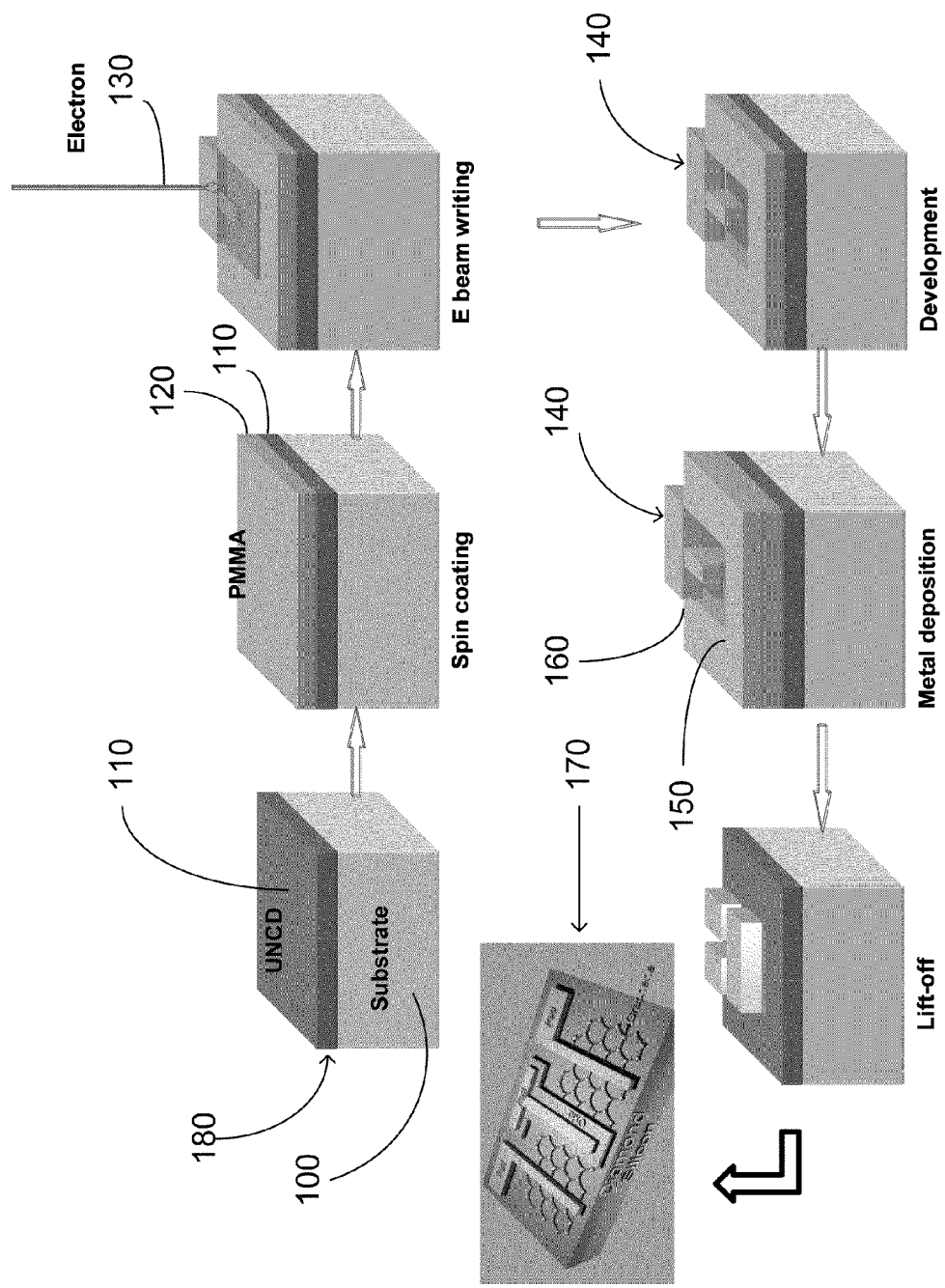
FIG. 1 illustrates a schematic of a top-down fabrication method for providing a graphene based device on a diamond substrate.

In one embodiment graphene-based devices can be fabricated by a top-down methodology to create graphene on a synthetic diamond substrate. As shown in FIG. 1 a starting material 100 can be either single crystal diamond or UNCD/NCD ("nanocrystalline diamond") thin film deposited on a silicon substrate with a transferred graphene layer 110 on the top. The next step in the process is to spin coat a photoresist 120 followed by e-beam lithography 130 to pattern the graphene layer 110 and perform a reactive ion etch (RIE) to transfer the pattern 140. The next step is deposition of Au/Ti as metal contacts 150. A gate dielectric of $HfO_2$ 160 is also deposited using an atomic layer deposition (hereinafter "ALD") process for three terminal devices. Finally, a lift-off process is used to etch away extra metal from unwanted regions. The final configuration of device 170 is as shown in a schematic displayed as an inset at the end of process flow-chart.

Figures 2A, 2B:
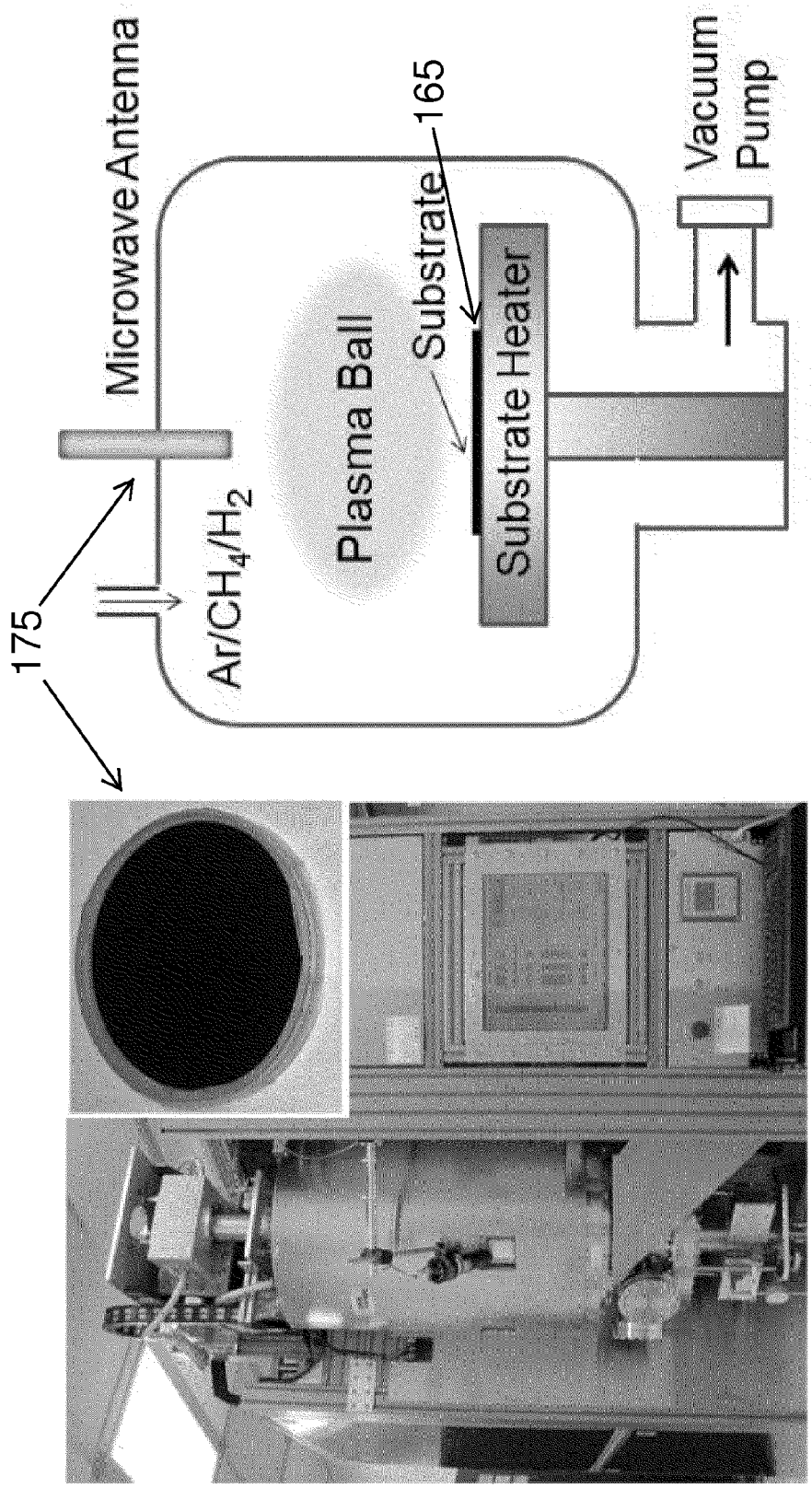
FIG. 2A illustrates an MPCVD system used to implement the schematic method of FIG. 1.
FIG. 2B provides a schematic describing UNCD growth in a MPCVD system.

The UNCD films for this study were grown on Si substrates 165 in a conventional microwave plasma chemical vapor deposition (MPCVD) system 175 at the Argonne National Laboratory (ANL). FIGS. 2A and 2B show the MPCVD system 175 used for the growth inside a cleanroom and schematic of the process, respectively. The growth conditions were altered to obtain larger D, in the range 5-10 nm, instead of typical grain sizes D≈2-5 nm in UNCDs. This was done to increase K of UNCD without strongly increasing the surface roughness. We intentionally did not increase D beyond 10 nm or used MCD in order to keep δH in the range suitable for polishing. The inset shows a 100-mm UNCD/Si wafer. Details of the original growth process developed at ANL are described hereinafter.

Figures 2C, 2D, 2E:
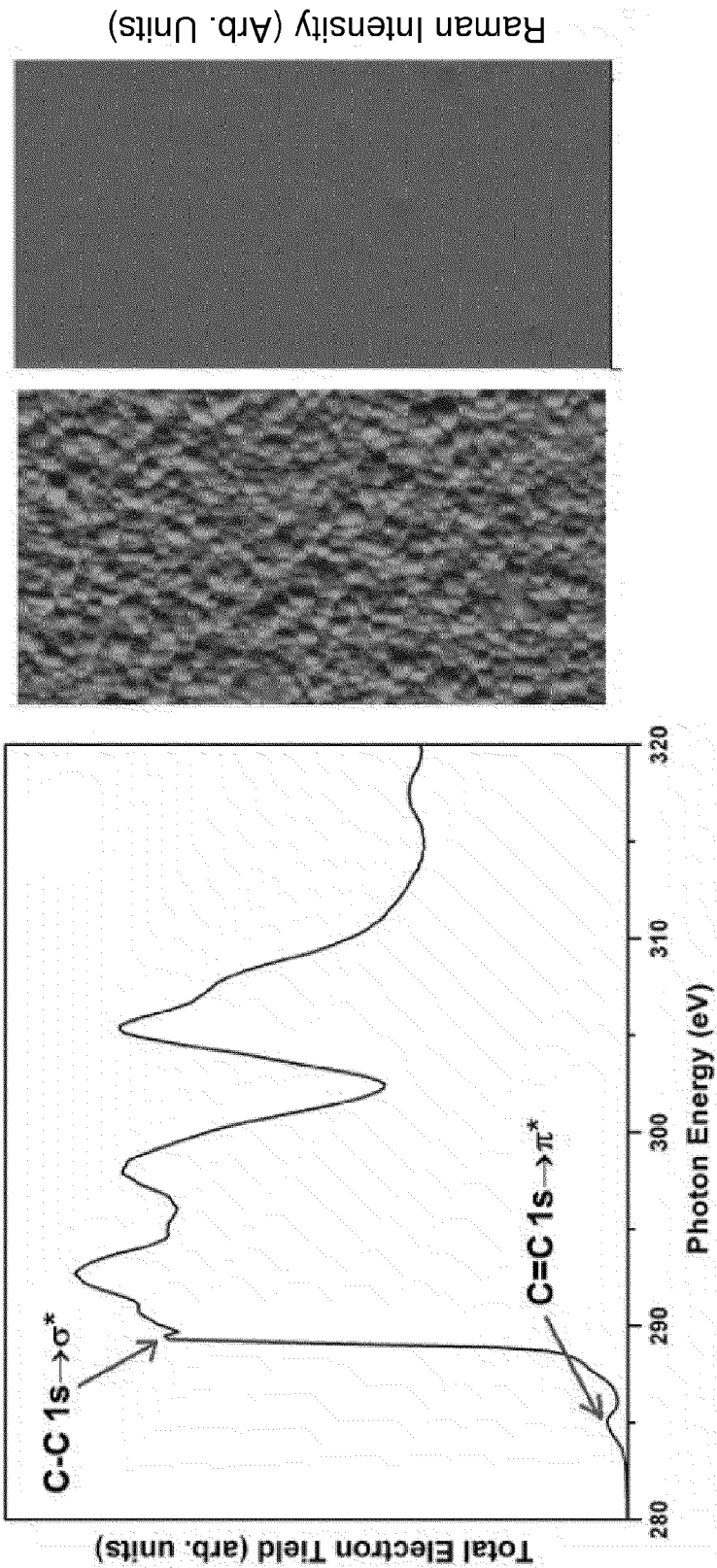
FIG. 2C illustrates NEXAFS data for deposited UNCD thin films.
FIG. 2D illustrates an AFM image of as grown UNCD.
FIG. 2E illustrates an AFM image of chemically/mechanically polished UNCD.

The surface roughness of the synthetic diamond substrate 100 plays an important role in reducing electron scattering at the graphene-diamond interface 180 and increasing the electron mobility, μ. We performed the chemical mechanical polishing (hereinafter "CMP") to reduce the as-grown surface roughness from δH≈4-7 nm to below δH≈1 nm, which resulted in a corresponding reduction of the thickness, H, from the as-grown H≈1 μm to ~700 nm. The H value was selected keeping in mind conditions for graphene visualization on UNCD together with the thermal management requirements (see Example I). The SCD substrates 100 were type IIb (100) grown epitaxially on a seed diamond crystal and then laser cut from the seed. For the graphene devices 170 fabrication, the SCD substrates 100 were acid washed, solvent cleaned and put through the hydrogen termination process in a conventional manner. The near-edge ray absorption fine-structure spectrum (NEXAFS) of the grown UNCD film 100 confirms its high $sp^3$ content and quality (FIG. 2C). The strong reduction of δH is evident from the atomic force microscopy ("AFM" hereinafter) images of the as grown UNCD and UNCD after CMP presented in FIGS. 2D and 2E, respectively. The surface treatment procedures developed for this study are described in the "Methods" subsection hereinafter.

Figure 2F:
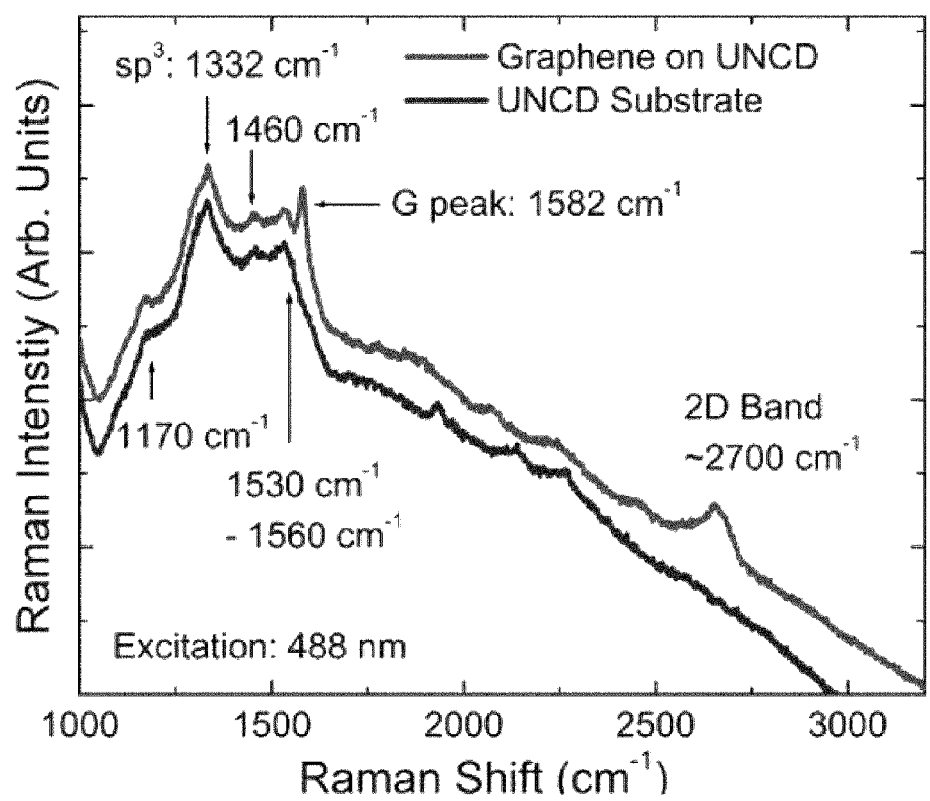
FIG. 2F illustrates Raman spectra of graphene on UNCD and separately for the UNCD substrate.
Figure 2G:
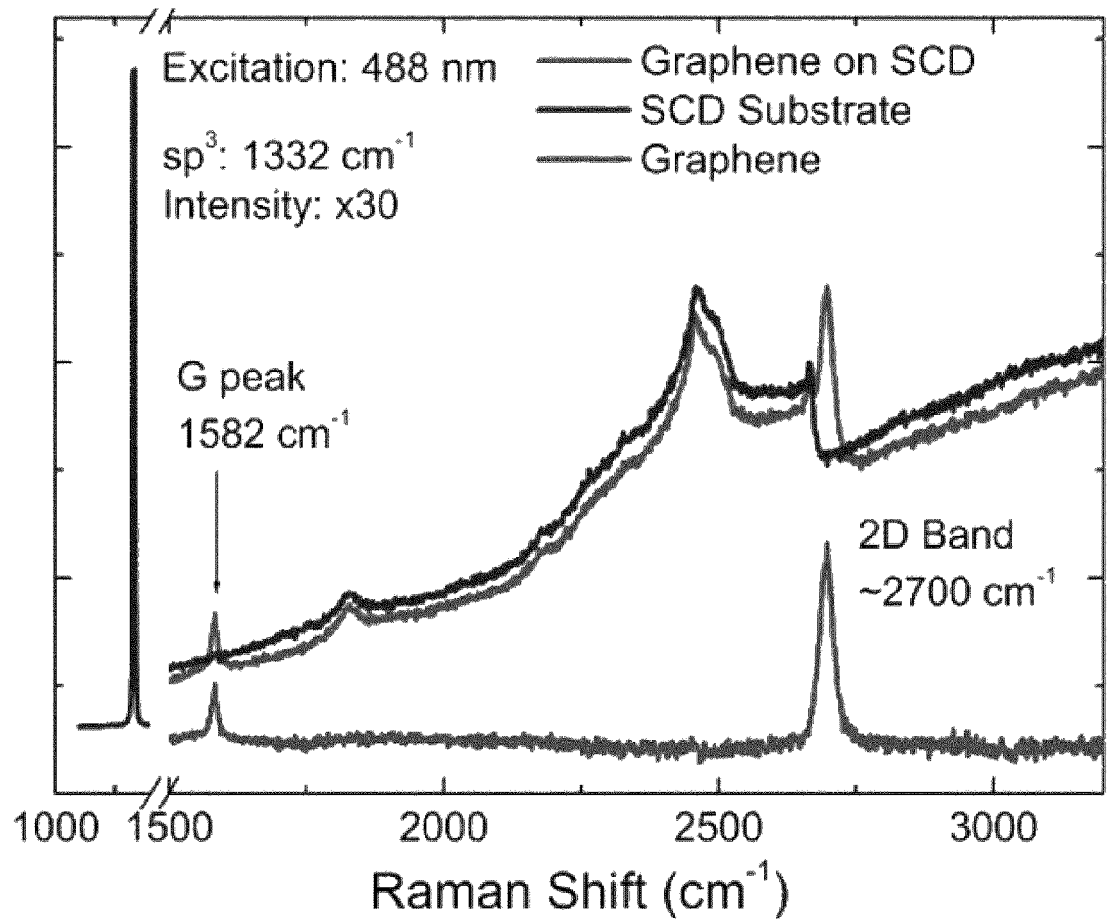
FIG. 2G illustrates Raman spectra of graphene on SCD and the SCD substrate.

The graphene and few-layer graphene ("FLG" hereinafter) were prepared by exfoliation from the bulk highly oriented pyrolytic graphite to ensure the highest quality and uniformity. We selected flakes of the rectangular-ribbon shape with the width W≥1 μm, which is larger than the phonon mean free path Λ~750 nm in graphene. The condition W>Λ ensured that K does not undergo additional degradation due to the phonon-edge scattering, allowing us to study the breakdown limit of graphene itself. The length, L, of graphene ribbons was in the range of about 10-60 μm. We further chose ribbons with the small aspect ratio γ=W/L~0.03-0.1 to imitate interconnects. Raman spectroscopy was used for determining the number of atomic planes, n, in FLG although the presence of $sp^2$ carbon at the grain boundaries in the UNCD 100 made the spectrum analysis more difficult. FIG. 2F shows spectra of the graphene-on-UNCD/Si and UNCD/Si substrate. One can see a 1332 $cm^{-1}$ peak, which corresponds to the optical vibrations in the diamond crystal structure. The peak is broadened due to the small D in UNCD. The bands at ~1170, 1500 and 1460 $cm^{-1}$ are associated with the presence of trans-poly-acetylene and $sp^2$ phase at grain boundaries. The graphene G peak at 1582 $cm^{-1}$ and 2D band at ~2700 $cm^{-1}$ are clearly recognizable. FIG. 2G presents spectra of the graphene-on-SCD, SCD substrate and difference between the two. The intensity and width of 1332 $cm^{-1}$ peak confirms that we have single-crystal diamond.

In preferred embodiments the devices 170 were made of FLG with n≤5. FLG supported on substrates or embedded between dielectrics preserves its transport properties better than single layer graphene. Two-terminal (i.e., interconnects) and three-terminal (i.e., FETs) devices were fabricated on both UNCD/Si and SCD substrates. The electron-beam lithography (EBL) was used to define the source, drain contacts, and gate electrodes. The contacts consisted of a thin Ti film 200 covered by a thicker Au film 210. A top-gate $HfO_2$ dielectric layer 230 was grown by the atomic layer deposition ("ALD" hereinafter). In a preferred embodiment as compared to a basic prior art graphene-on-$SiO_2$/Si devices, the gate electrode 220 and the graphene pad 110 were completely separated by the $HfO_2$ dielectric layer 230 to avoid oxide lift-off sharp edges, which can affect connection of the gate electrode 220. FIGS. 3A(1) and (2) show schematics of the fabricated devices 170 with details. For testing the breakdown current density in FLG we used two-terminal devices 230 in order to minimize extrinsic effects on the current and heat conduction. Three-terminal devices 240 were utilized for μ mobility measurements. Conventional graphene-on-$SiO_2$/Si devices were prepared as references. FIG. 3B is an optical microscopy image of a two terminal graphene-on-SCD device. FIGS. 3C and 3D show the scanning electron microscopy (SEM) images of the two-terminal and three-terminal graphene-on-UNCD devices, respectively.

Figure 4A:
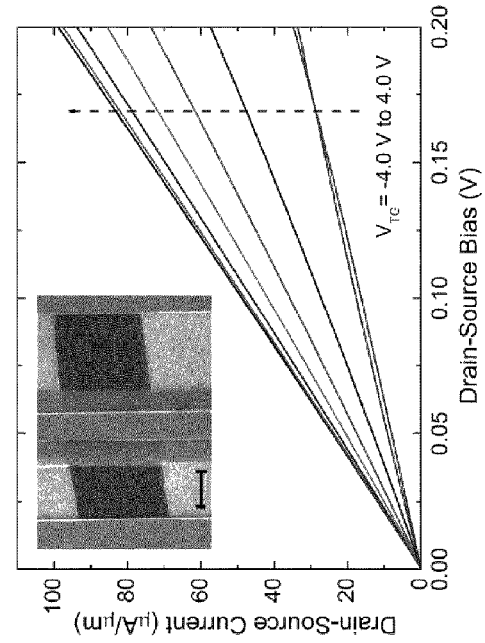
FIG. 4A illustrates thermal resistance of an UNCD/Si substrate and a reference Si wafer.

In a preferred embodiment characterization was performed for >40 in number of the graphene-on-diamond devices 170 and for >10 in number of the graphene-on-$SiO_2$/Si reference devices 170. To understand the origin of the breakdown $J_{BR}$ values were correlated with the thermal resistances of the substrates. The effective K of the substrates was measured and their thermal resistance determined as $R_T=H_S/K$, where $H_S$ is the substrate thickness. For details of the thermal measurements see Example I. FIG. 4A shows thermal resistance, $R_T$, for the UNCD/Si and Si/SiO$_2$ (300-nm) substrates as a function of T. Note that $R_T$ for Si increases approximately linear with T, which is expected because the intrinsic thermal conductivity of crystalline materials decreases as $K \sim 1/T$ for T above RT. The T dependence of $R_T$ for UNCD/Si is notably different, which results from interplay of heat conduction in UNCD and Si. In UNCD, K grows with T due to increasing inter-grain transparency for the acoustic phonons that carry heat. UNCD/Si substrates, despite being more thermally resistive than Si wafers at RT, can become less thermally resistive at high T. The $R_T$ value for SCD substrate is $\sim 0.25 \times 10^{-6}$ m$^2$K/W, which is more than order-of-magnitude smaller than that of Si at RT. The thermal interface resistance, $R_B$, between FLG and the substrates is $R_B \approx 10^{-8}$ m$^2$K/W, and it does not strongly depend on either n or the substrate material. For this reason, $R_B$ does not affect the $R_T$ trends.

Figure 4B:
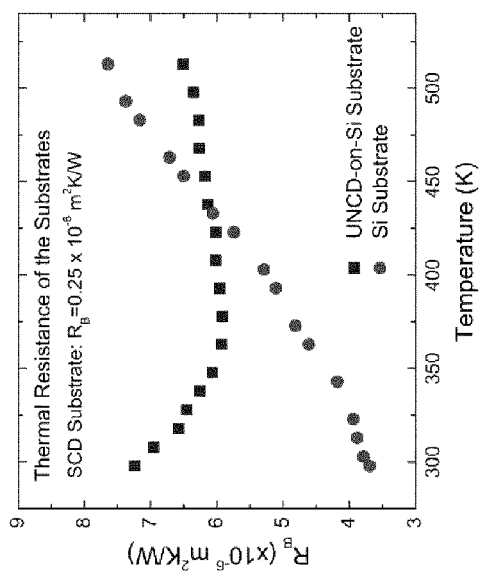
FIG. 4B illustrates low field current voltage characteristics of a top gate graphene layer on a SCD device.
Figure 4C:
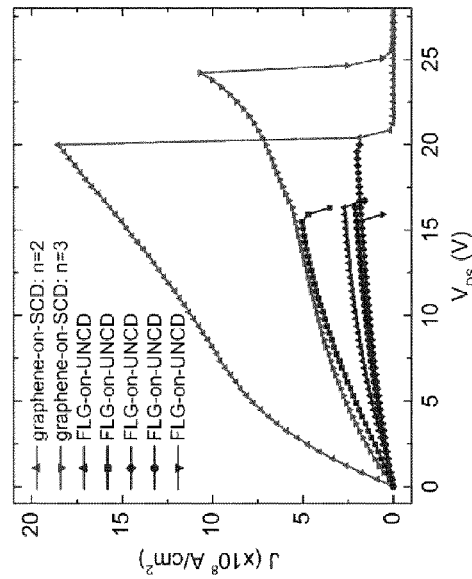
FIG. 4C illustrates source drain current for the three terminal graphene layer deposited on an UNCD device as a function of top gate voltage bias.
Figure 4D:
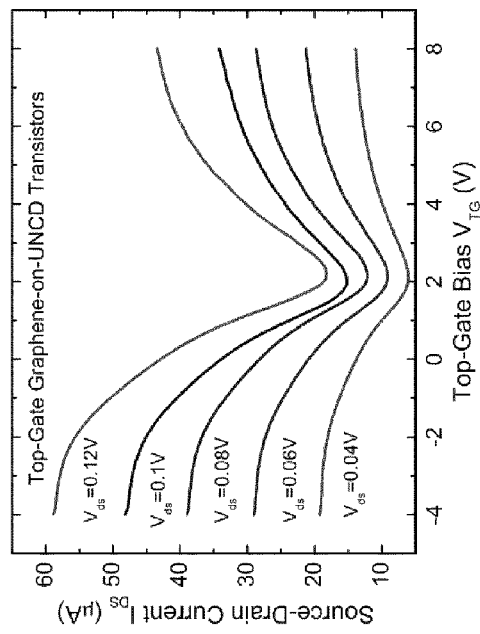
FIG. 4D illustrates breakdown current density in the two dimensional graphene on UNCD and graphene layer on a SCD device.

FIG. 4B shows current-voltage (I-V) characteristics of graphene-on-SCD FET at low source-drain voltages for different top-gate, $V_{TG}$, bias. The inset demonstrates a high quality of the HfO$_2$ dielectric and metal gate deposited on top of graphene channel. The linearity of I-Vs confirms that the contacts are Ohmic. FIG. 4C presents the source-drain, $I_{SD}$, current as a function of $V_{TG}$ for graphene-on-UNCD FET. In the good top-gate graphene-on-diamond devices the extracted µ was ~1520 cm$^2$V$^{-1}$s$^{-1}$ for electrons and ~2590 cm$^2$V$^{-1}$s$^{-1}$ for holes. These mobility values are acceptable for applications in downscaled electronics. In FIG. 4d we show results of the breakdown testing. For graphene-on-UNCD, we obtained $J_{BR} \approx 5 \times 10^8$ A/cm$^2$ as the highest value, while the majority of devices broke at $J_{BR} \approx 2 \times 10^8$ A/cm$^2$. The reference graphene-on-SiO$_2$/Si had $J_{BR} \approx 10^8$ A/cm$^2$, which is consistent with conventional findings. The maximum achieved for graphene-on-SCD was as high as $J_{BR} \approx 1.8 \times 10^9$ A/cm$^2$. This is an important result, which shows that via improved heat removal from graphene channel one can reach, and even exceed, the maximum current-carrying capacity of ~10 µA/nm$^2$ (=1$\times 10^9$ A/cm$^2$) reported for CNTs. Without limiting the invention, the surprising improvement in $J_{BR}$ for graphene-on-UNCD is explained by the reduced $R_T$ at high T where the failure occurs. At this temperature, $R_T$ of UNCD/Si can be lower than that of Si/SiO$_2$ (see FIG. 4A).

The location of the current-induced failure spot and $J_{BR}$ dependence on electrical resistivity, ρ, and length, L, can shed light on the physical mechanism of the breakdown. While not limiting the scope of the invention, the failures in the middle of CNTs and $J_{BR} \sim 1/\rho$ were interpreted as signatures of the electron diffusive transport, which resulted in the highest Joule heating in the middle. The failures at the CNT-metal contact were attributed to the electron ballistic transport through CNT and energy release at the contact. There is a difference in contacting CNT with the diameter d~1 nm and graphene ribbons 110 with W≥1 µm. It is easier to break CNT-metal than the graphene-metal contact thermally. In our study, we observed the failures both in the middle and near the contact regions (see FIG. 5). The difference between these two types was less pronounced than that in CNTs. The failures occurred not exactly at the graphene-metal interface but on some distance, which varied from sample to sample. We attributed it to the width variations in graphene ribbons leading to breakdowns in the narrowest regions, or in the regions with defects, which are distributed randomly. We did not observe scaling of $J_{BR}$ with ρ like in the case of CNTs.

Figure 5:
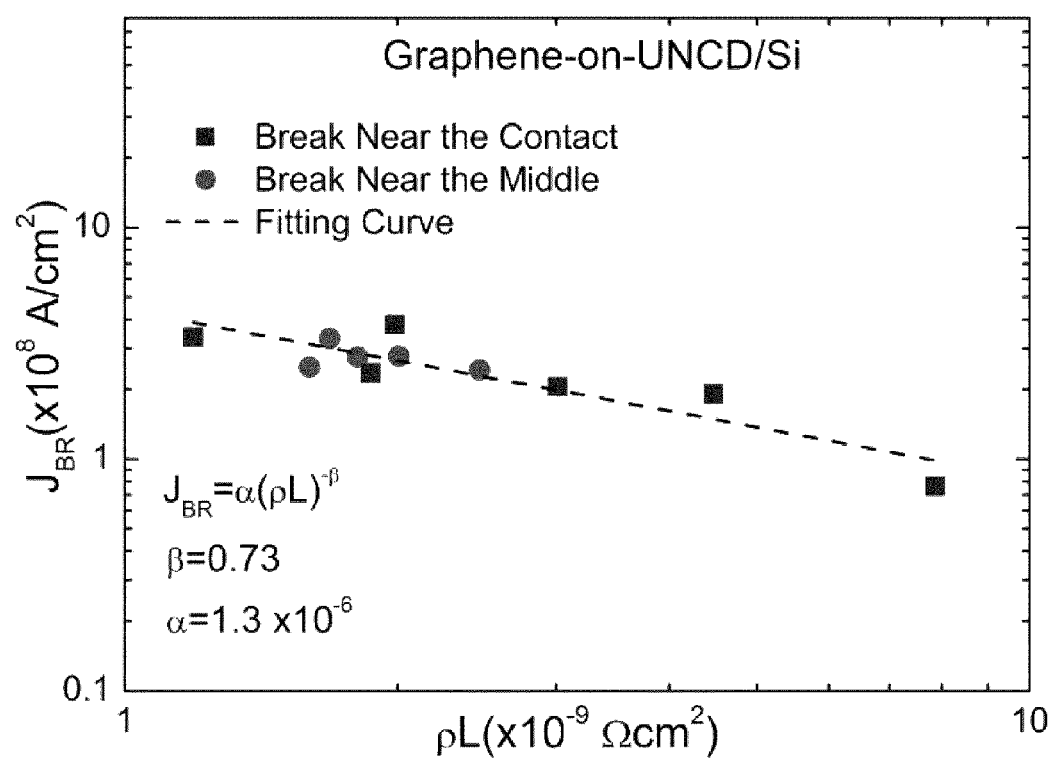
FIG. 5 illustrates scaling of breakdown current density wherein $J_{BR}$ is shown as a function of electrical resistance and length of graphene interconnects.

$J_{BR}$ for graphene scaled well with ρL, and FIG. 5 shows data for graphene-on-UNCD with a similar aspect ratio. From the fit to the experimental data we obtained $J_{BR}=\alpha(\rho L)\beta$, where $\alpha=1.3\times 10^{-6}$ and $\beta=0.73$. For graphene-on-SCD, the slope is $\beta=0.51$. Previously, the scaling with $(\rho L)^{-\beta}$ (where $\beta=0.6-0.7$) was observed in carbon nanofibers (CNF), which had a similar aspect ratio. Such $J_{BR}$ (ρL) dependence was explained from the solution of the heat diffusion equation, which included thermal coupling to the substrate. However, the thermally induced $J_{BR}$ for CNF was ~10$^6$ A/cm$^2$—much smaller than the record $J_{BR} \approx 1.8 \times 10^9$ A/cm$^2$ we obtained for graphene-on-SCD.

In a preferred embodiment, the UNCD thin films were grown on 100-mm diameter Si substrates 165 in the 915 MHz large-area microwave plasma chemical vapor deposition ("MPCVD" hereinafter) system 175 (DiamoTek 1800 series 915 MHz, 10 KW from Lambda Technologies Inc.) operating in the clean room at the Argonne National Laboratory. Prior to the growth, silicon substrate were deposited with 10 nm tungsten layer using sputter deposition process followed by nanodiamond seeding treatment using the nanodiamond suspension containing dimethylsulphoxide (DMSO) solution (ITC, Raleigh, N.C.). Details about MPCVD and seeding process for the UNCD growth are described in Example I. The single crystal diamonds used for this study were type IIb with (100) orientation (Delaware Diamond Knives) polished from both sides down to ~3-nm RMS roughness. A pre-cleaning procedure using acid wash and solvent cleaning was used to etch any contaminants from the surface. The H-termination process with microwave plasma was carried at the substrate T=700° C. using H$_2$ flow of 50 sccm and chamber pressure of 30 mbar for 10-15 mins. The process eliminates any hydrocarbon and oxygenated impurities and produces clean terminated diamond surface. We defined the top-gate region using EBL (NPGS controlled Leo 1550) and performed ALD (Cambridge Nanotech) of 20-nm thick HfO$_2$ at T=110° C. The lift-off of ALD was done in hot acetone (T=60° C.) for ~2 hours. We often observed oxide leftovers at the edges of the defined 9 regions, which can lead to discontinuities in the following metal layer. To avoid this problem, we designed HfO$_2$-layer insert under the entire region of gate electrode and pad. We then used EBL to define the source, drain and top gate electrodes regions and deposit Ti/Au (10 nm/100 nm) by E-beam evaporator (Temescal BJD-1800). The gate leakage in our devices was very low (much smaller than 0.1 nA/µm$^2$). We established that our polished UNCD/Si substrates do not require a seeding layer for ALD of HfO$_2$ gate dielectric.

In yet another embodiment, the graphene can be grown at low temperatures (about 400-500° C.). Preferably this process involves graphene growth directly on an Ni surface on a substrate (like a diamond substrate) using a solid carbon precursor which allows graphene growth of single or multiple layers in a highly controlled manner. Such a method is quite compatible with a complementary metal oxide semiconductor ("MOS" hereinafter) manufacturing processes.

In this preferred embodiment, several steps are used to produce the desired graphene layers. The substrate is preferably Ni which can take the form of Ni thin film (such as, for example, 300 nm) or even bulk Ni foil. In the case of thin film Ni as the substrate, the Ni thin film is deposited on a silicon substrate with a intermediate titanium (Ti) adhesion layer (thickness: 10-20 nm). The use of a silicon dioxide (SiO$_2$) layer is not required but could be used in case of device isolation. The next step in the process is to mix two polymers in the solid form (n-octacosane and n-tetracosane) in 1:1 (wt.

percentage) and heat the mixture on a hot plate to a temperature of about 80° C. so that it converts into a viscous liquid form. The prepared polymer solution is then spin-coated on the surface of the Ni film followed by cooling the substrate to room temperature so that the polymer solution converts into a thick solid layer. The polymer coated Ni substrate is then transferred into the vacuum furnace for graphene growth. The Ar gas (2000 sccm) was then flown into the chamber with the chamber pressure maintained at 300 Torr. The temperature of the vacuum furnace was then raised at around 400-500° C. and maintained for 15-20 mins. This process essentially discomposes the polymer layer on the top of the surface of the Ni and starts precipitating a carbon rich layer on the Ni surface. In the next step, the substrate is cooled from 400-500° C. to room temperature at the rate of about 15-30° C./min. This rapid cooling rate converts the graphitic carbon into the graphene layers. The yield and quality of the graphene layers can be improved further by using carbon precursor gas to accelerate the growth of graphene. In that case, an Ar/Ethanol gas mixture can be flowed into a chamber during the growth at 400-500° C. for few minutes to grow large grain size of the graphene.

This method therefore allows growing multilayer graphene on Ni substrate at low temperature (about 400-500° C.). This method also allows growth of graphene at temperatures compatible with a typical CMOS thermal budget, which opens-up the possibility of integration of the graphene with CMOS electronics. This is a crucial step in developing graphene based hybrid devices with efficient thermal management. No source of carbon containing gas for the graphene growth is required since a polymer layer coated on the substrate itself acts as a solid carbon source. The low temperature process requires less energy than the conventional growth process that occurs at 1000° C., which directly affects economics of fabricating graphene devices on commercial scale. The low temperature growth process was done on a 4 inch diameter wafer but could be easily scalable to large area.

Methods

The near edge ray absorption fine structure spectroscopy (NEXAFS) of the UNCD sample was carried out at the University of Wisconsin Synchrotron Radiation Center Facility. The data was acquired at HERMON beam at carbon K edge with high energy resolution (0.2-0.4 eV). The spectra were taken in the total electron yield (TEY) mode with the incident photon beam normal to the sample. Special care was taken to correct for the carbon contamination from the X-ray beam optics and transmission structure from the monochromator. Details of the measurements are described in the Examples.

Figure 6:
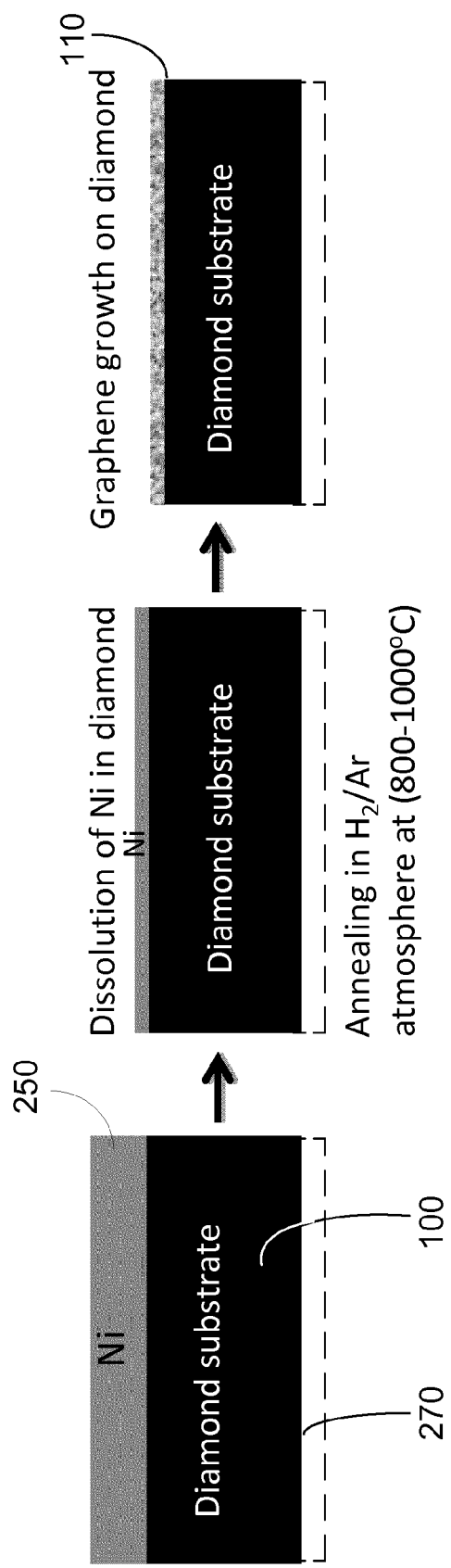
FIG. 6 illustrates a schematic diagram of process steps to obtain direct graphene growth on diamond.
Figure 7A:
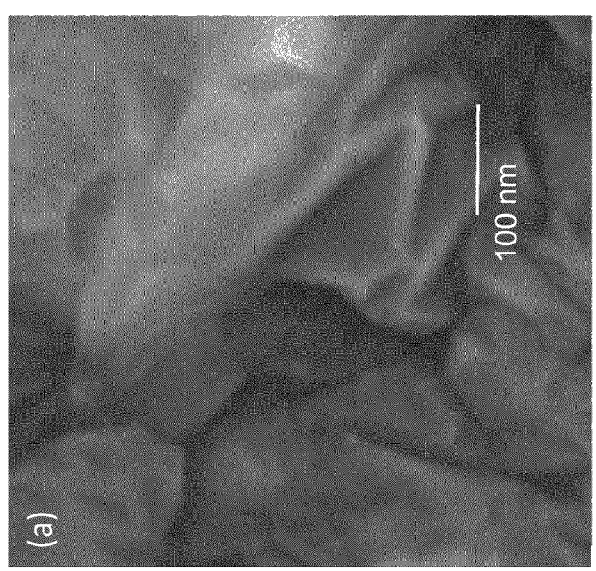
FIG. 7A illustrates an SEM image of a diamond film covered with conformal graphene layer.
Figure 7B:
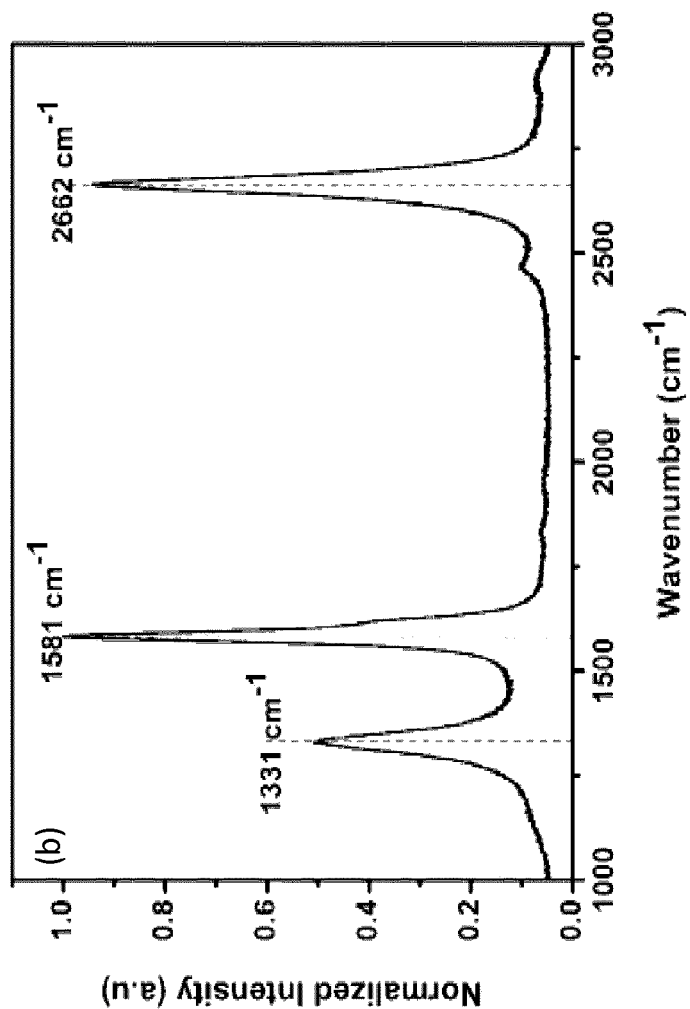
FIG. 7B illustrates Raman spectra confirming growth of a few nm thick layer graphene on the diamond.

In the embodiment of direct growth of graphene on a diamond substrate, as shown in FIG. 6 the starting material is either single crystal diamond 100 or UNCD/NCD thin film 100 deposited on a silicon substrate 260 (shown in phantom) with Ni thin film (typical thickness: 30 nm) 250 deposited on the top of the diamond 100 or the UNCD/NCD thin film 100. The next step in the process is to anneal the substrate in vacuum furnace in H$_2$/Ar gas mixture (50:50 ratio) at around 800-1000° C. for 15-20 mins. This process essentially dissolves the Ni 250 into the diamond 100 due to the strong catalytic reaction with the diamond 100. During this process, part of the Ni 250 diffuses into the diamond 100 and starts graphitizing the diamond 100. At the end of this process, a few nanometers of the diamond surface from the top surface is completely graphitized; and the layer mostly consists of graphitic carbon. The next step, involves cooling the substrate from 800-1000° C. to room temperature with the rate of about 30° C./min at the beginning to about 15° C. at the end. This rapid cooling rate converts the graphitic carbon into the graphene layers 110. The yield and quality of the graphene layers 110 could be improved further by using a carbon precursor gas to accelerate the growth of the graphene 110. In that case, we used Ar/Ethanol gas mixture at 1000° C. for few minutes to grow large grain size graphene 110. It is preferable that the Ni content should be small enough so that it ends up utilizing all of the Ni during the growth; and therefore the high quality growth of the graphene 110 can be achieved without trace amount of Ni in sub-surface regions of the diamond 100.

Example I

Figure 8:
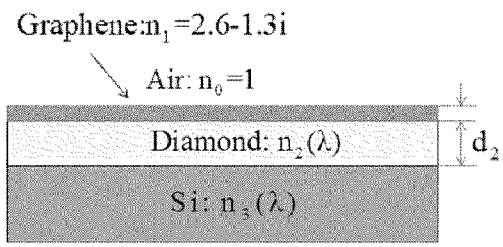
FIG. 8 illustrates a schematic of a graphene layer on a diamond/Si substrate.

Fabrication of the graphene devices 170 relies on the fact that the graphene 110 can be visualized using optical microscopy if prepared on top of UNCD/Si wafers with a certain thickness of the UNCD 100. Before the diamond growth and graphene device fabrication we estimated an approximate thickness of UNCD required to make graphene visible using Fresnel's law. The results were checked experimentally. Consider the case of normal light incidence from air (refractive index $n_o=1$) on a tri-layer structure consisting of the graphene 110, the diamond 100, and the Si 165 as shown in FIG. 8. The visibility of the graphene 110 on different types of substrates originates from both the relative phase shift and amplitude modification induced by the graphene layer 110. The complex refractive indices of silicon and diamond used in the calculations were adopted from literature The Si substrate was considered semi-infinite and the refractive indices of Si, $n_3$, were assumed to be wavelength dependent. The refractive index of graphene is assumed to be independent of λ: $n_g(\lambda)=$ 2.6−1.3i Calculations of the contrast spectra were performed using conventional methods:

$$C = \frac{R_{without\_graphene}(\lambda) - R_{with\_graphene}(\lambda)}{R_{without-graphene}(\lambda)}$$

Here $R_{without\_graphene}(\lambda)$ is the reflection spectrum from the diamond substrate and $R_{with\_graphene}(\lambda)$ is the reflection spectrum from the graphene sheet.

$$R(\lambda) = \left|\frac{r_a}{r_b}\right|^2 \quad (1)$$

$$r_a = (r_1 e^{i(\beta_1+\beta_2)} + r_2 e^{-i(\beta_1+\beta_2)} + r_3 e^{-i(\beta_1+\beta_2)} + r_1 r_2 r_3 e^{-i(\beta_1+\beta_2)}) \quad (2)$$

$$r_b = (e^{i(\beta_1+\beta_2)} + r_1 r_2 e^{-i(\beta_1+\beta_2)} + r_1 r_3 e^{-i(\beta_1+\beta_2)} + r_2 r_3 e^{-i(\beta_1+\beta_2)}) \quad (3)$$

where $r_1=(n_0-n_1)/(n_0+n_1)$, $r_2=(n_1-n_2)/(n_1+n_2)$ and $r_3=(n_2-n_3)/(n_2+n_3)$ are the reflection coefficients for different interfaces and $\beta_1=2\pi n_1(d_1/\lambda)$, $\beta_2=2\pi n_2(d_2/\lambda)$, are the phase differences when light passes through the media, which are determined by the path difference of the two neighboring interfering light beams.

Figure 9:
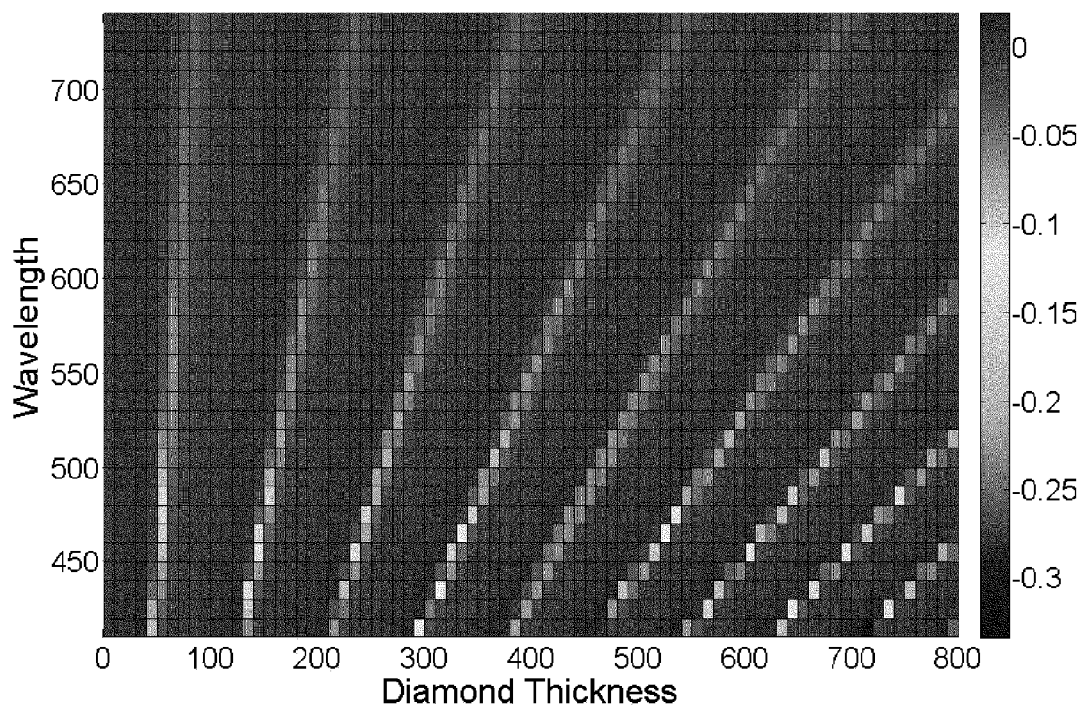
FIG. 9 illustrates a gray scale plot of contrast as a function of wavelength and diamond thickness with the gray scale contrast key on the right.
Figure 10:
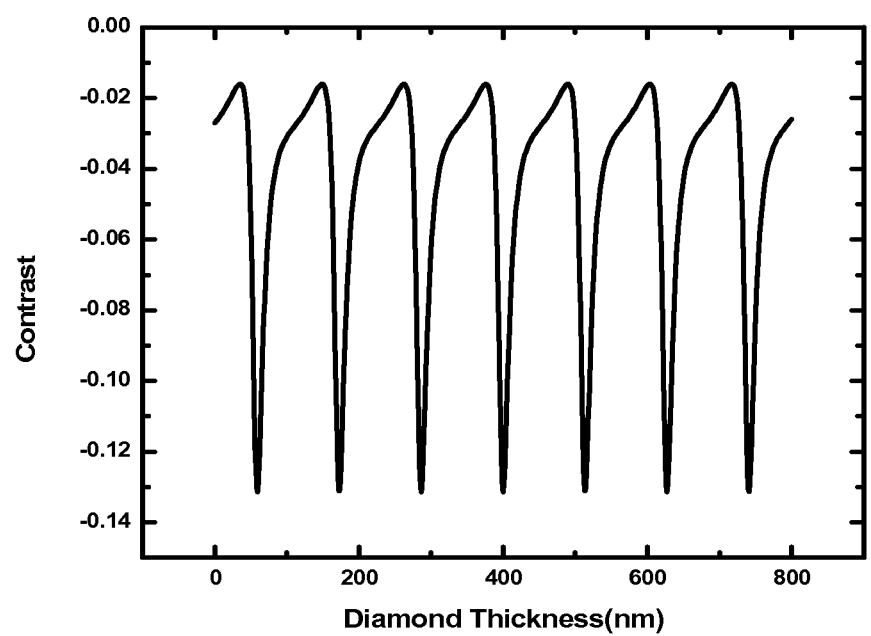
FIG. 10 illustrates contrast as a function of diamond thickness at a fixed wavelength.

The simulations were carried out using conventional MATLAB software. The incident wave was assumed to be perpendicular to the plane of the multiple layers. This is a reasonable assumption because the total thickness of graphene/diamond is much smaller than the depth of focus of the objective lens used in most experiments (0.9-1.8 μm for λ=0.4-0.8 μm and the numerical aperture of 0.95) within the depth of focus. For this reason the wave front of the focused light is almost flat. FIG. 9 shows the calculated grayscale plot for the expected contrast as a function of the diamond thickness and wavelength with the diamond thickness ranging from 0 to 800 nm and the wavelength ranging from 400 nm to 700 nm. One can see from FIG. 9 that graphene on diamond/Si exhibits a negative contrast, i.e., graphene on diamond/Si appears brighter than the substrate. Fixing the wavelength at 555 nm (the most sensitive wavelength to human eye) one gets the thickness of UNCD with the highest contrast to be around 650 nm (see FIG. 10).

Example II

The effective thermal conductivity of the polished UNCD/Si wafers was measured using the transient plane source (TPS) "hot disk" technique which is conventional and well known. The thermal conductivity of SCD was measured with the "laser flash" technique, which is more accurate for the materials with high K values. The measured thermal conductivity data was used to determine the thermal resistance of the substrates.

Figure 11:
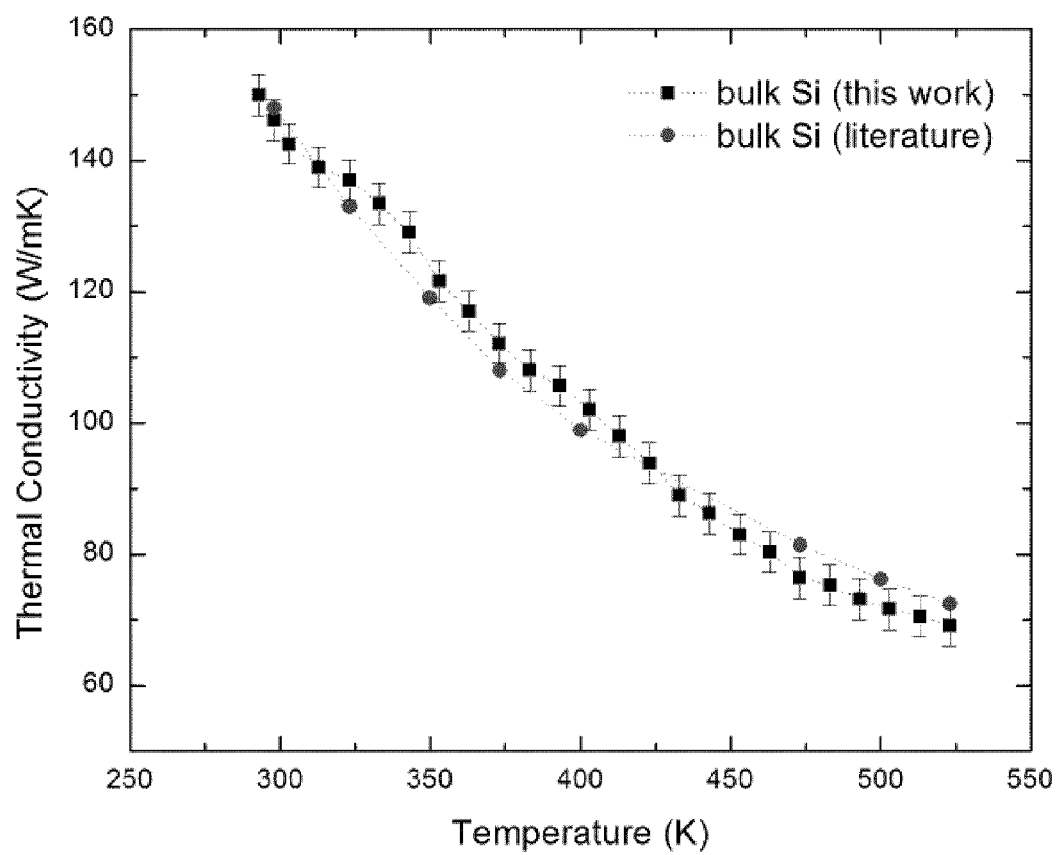
FIG. 11 illustrates thermal conductivity of Si wafers measured (squares) versus literature reported values (circles)
Figure 12:
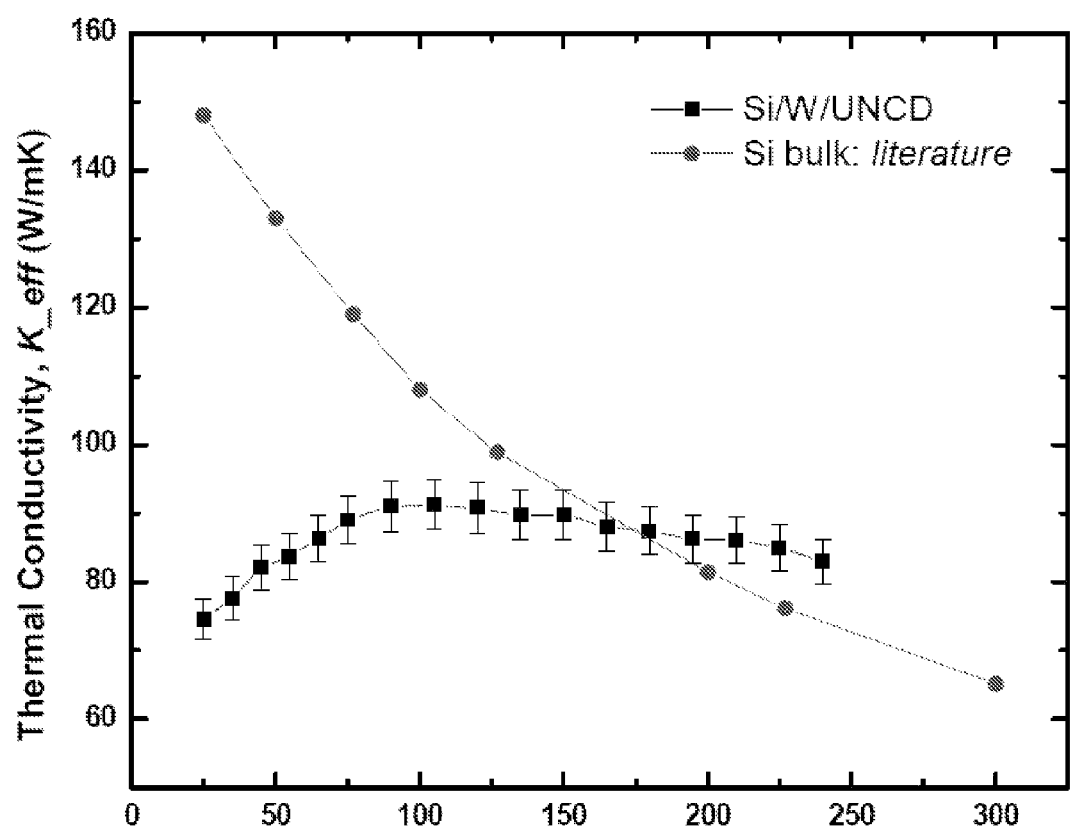
FIG. 12 illustrates thermal conductivity as a function of temperature for an UNCD/Si substrate and reference bulk Si.

In the TPS method, an electrically insulated flat nickel sensor is placed between two pieces of the substrate. The sensor is working as the heater and thermometer simultaneously. A current pulse is passed through the sensor during the measurement to generate the heat wave. Thermal properties of the material are determined by recording temperature rise as a function of time using the equation, $\Delta T(\tau) = P(\pi^{3/2} rK)^{-1} D(\tau)$, where $\tau = (t_m \alpha/r^2)^{1/2}$, $\alpha$, is the thermal diffusivity, $t_m$ is the transient measurement time, r is the radius of the sensor, p is the input heating power, and $D(\tau)$ is the modified Bessel function. The time and the input power are chosen so that the heat flow is within the sample boundaries and the temperature rise of the sensor is not influenced by the outer boundaries of the sample. To make sure that our system is properly calibrated we measured thermal conductivity of standard Si wafers and compared the results with the literature values. One can see FIG. 11 that our measured data are in excellent agreement with the previously reported values. The temperature dependence of the thermal conductivity $K \sim 1/T$ is also in agreement with the theory for high-quality crystals. FIG. 12 presents the measured $K_{eff}(T)$ for a reference Si wafer and a UNCD/Si composite substrates. The Si wafer's K scales as $\sim 1/T$, which is expected for semiconductor crystals near and above room temperature. The effective thermal conductivity of the UNCD/Si becomes larger than that of Si at higher temperature due to improved inter-grain phonon transparency in UNCD.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

The invention claimed is:

1. A method of forming graphene on a substrate for fabrication into an electronic device, comprising the steps of,
    providing a diamond substrate;
    depositing graphite on the diamond substrate,
    converting at least a portion of the graphite into graphene, thereby providing a component for use in an electronic device; and
    including the step of growing the diamond substrate on a Si substrate.

2. The method as defined in claim 1 further comprising depositing a nickel layer on the diamond substrate, wherein the graphite is deposited directly on the nickel layer.

3. The method as defined in claim 2 wherein the graphite comprises a highly oriented pyrolytic graphite, thereby enhancing quality of the transferred graphene.

4. The method as defined in claim 3 wherein the graphite comprises a ribbon-shape with width selected from the group of greater than about W≥1 µm and about 50-100 nm in width, thereby insuring stability of thermal conductivity.

5. A method of forming graphene on a substrate for fabrication into an electronic device, comprising the steps of,
    providing a diamond substrate;
    depositing graphite on the diamond substrate,
    converting at least a portion of the graphite into graphene, thereby providing a component for use in an electronic device; and
    including the steps of at least one of (a) converting the graphene with layers ranging from 1-5 and (b) embedding a plurality of the graphene layers, each being between a dielectric layer.

6. A method of forming graphene on a substrate for manufacturing an electronic device, comprising the steps of,
    providing a diamond substrate;
    forming a transition metal layer on the diamond substrate;
    dissolving the transition metal layer into the diamond substrate by an annealing step; and
    cooling the substrate to room temperature, thereby forming a graphene layer on the diamond substrate.

7. The method as defined in claim 6 wherein the diamond substrate is selected from the group of (a) single crystal diamond and (b) UNCD/NCD thin film diamond deposited on a Si substrate.

8. The method as defined in claim 6 wherein the transition metal layer comprises Ni.

9. The method as defined in claim 6 wherein the annealing step includes placing the diamond substrate in a vacuum furnace with a $H_2$/Ar gas mixture.

10. The method as defined in claim 6 wherein an annealing temperature is about 800-1000° C. and the cooling step is performed at a rate of about 30° C./minute.

11. The method as defined in claim 6 further including the step of providing a carbon precursor gas to accelerate graphene growth.

12. The method as defined in claim 11 wherein the carbon precursor gas comprises an Ar/ethanol gas mixture and the annealing temperature is about 1000° C., thereby growing large grain sizes for the graphene.

13. The method as defined in claim 6 wherein a thickness of the transition metal layer is established such that upon completing the dissolving step the transition metal from the transition metal layer has no trace amount in sub-surface regions of the diamond substrate.

14. A method of forming graphene on a substrate for fabrication into an electronic device, comprising the steps of,
    providing a diamond substrate selected from the group of (a) single crystal diamond and (b) UNCD/NCD thin film diamond deposited on a Si substrate;
    depositing graphite on the diamond substrate,
    converting at least a portion of the graphite into graphene, thereby providing a component for use in an electronic device.

* * * * *